(12) United States Patent
Zhang

(10) Patent No.: US 11,296,307 B2
(45) Date of Patent: Apr. 5, 2022

(54) OLED DISPLAY AND METHOD FOR MANUFACTURING SAME

(71) Applicant: Shenzhen China Star Optoelectronics Semiconductor Display Technology Co., Ltd., Guangdong (CN)

(72) Inventor: Liangfen Zhang, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 284 days.

(21) Appl. No.: 16/603,097

(22) PCT Filed: May 28, 2019

(86) PCT No.: PCT/CN2019/088807
§ 371 (c)(1),
(2) Date: Oct. 4, 2019

(87) PCT Pub. No.: WO2020/206824
PCT Pub. Date: Oct. 15, 2020

(65) Prior Publication Data
US 2021/0336235 A1    Oct. 28, 2021

(30) Foreign Application Priority Data
Apr. 11, 2019  (CN) .......................... 201910288341.6

(51) Int. Cl.
*H01L 27/32*    (2006.01)
*H01L 51/52*    (2006.01)
*H01L 51/56*    (2006.01)

(52) U.S. Cl.
CPC .......... *H01L 51/56* (2013.01); *H01L 27/3246* (2013.01); *H01L 51/5228* (2013.01)

(58) Field of Classification Search
CPC ............. H01L 27/3246; H01L 27/3279; H01L 51/5228
See application file for complete search history.

(56) References Cited

U.S. PATENT DOCUMENTS

| 6,274,887 | B1 | 8/2001 | Yamazaki et al. |
| 2016/0035807 | A1 | 2/2016 | Shi et al. |

(Continued)

FOREIGN PATENT DOCUMENTS

| CN | 108962955 A | | 12/2018 | |
| KR | 20160055670 A | * | 5/2016 | ......... H01L 27/3246 |
| KR | 20180013226 A | * | 2/2018 | |

OTHER PUBLICATIONS

English translation of KR 2016-0055670 A (Year: 2016).*
English translation of CN 108962955 (Year: 2018).*
Machine translation of KR 20180013226 A (Year: 2018).*

*Primary Examiner* — Bryan R Junge
(74) *Attorney, Agent, or Firm* — Taft Stettinius & Hollister LLP

(57) ABSTRACT

The present disclosure provides an OLED display and a method for manufacturing the same. The method comprises steps of forming a planarization layer on the auxiliary electrode, wherein the planarization layer includes an opening; forming a transparent conductive layer and a pixel defining layer on the planarization layer, and patterning the same, such that both the transparent conductive layer and the pixel defining layer is located above the opening to shield a side of the opening that is adjacent to a non-display area; and forming a cathode electrode on the pixel defining layer by evaporation, such that the cathode electrode partially covers a side of the auxiliary electrode.

18 Claims, 2 Drawing Sheets

(56) References Cited

U.S. PATENT DOCUMENTS

| | | | | |
|---|---|---|---|---|
| 2016/0293888 A1* | 10/2016 | Shim | .................... | H01L 51/5228 |
| 2017/0317154 A1* | 11/2017 | Heo | .................... | H01L 27/3211 |
| 2018/0097047 A1* | 4/2018 | Jung | .................... | H01L 51/5225 |
| 2018/0122876 A1* | 5/2018 | Shim | .................... | H01L 27/3276 |
| 2019/0115403 A1* | 4/2019 | Kang | ....................... | H01L 51/56 |
| 2020/0212121 A1* | 7/2020 | Kang | .................. | H01L 27/3211 |

* cited by examiner

US 11,296,307 B2

OLED DISPLAY AND METHOD FOR MANUFACTURING SAME

CROSS-REFERENCE TO RELATED APPLICATIONS

This application is a U.S. National Phase of International PCT Application No. PCT/CN2019/088807 filed May 28, 2019, which claims the benefit of Chinese Patent Application Serial No. 201910288341.6 filed Apr. 11, 2019, the contents of each application are incorporated herein by reference in their entirety.

FIELD OF INVENTION

The present disclosure relates to a field of display technology, and more particularly, to an organic light emitting diode (OLED) display and a method for manufacturing the same.

BACKGROUND

In comparison with liquid crystal displays (LCDs) which passively emit light, organic light emitting diode (OLED) displays actively emit light, and have advantages, such as short response times, high contrast, and wide viewing angles. Moreover, OLED displays can be made to be flexible. Therefore, OLED displays have been widely used, and it is possible that OLED displays will be the mainstream products among various display techniques in the next generation.

Currently, the material used to form a cathode electrode of a top-emission OLED device has a high transmittance, but it also has a high resistance or a low electrical conductivity. Thus, for large-sized OLED displays, IR-drop occurs when the displays display images. The current solution for solving this problem is to add an auxiliary electrode. Nevertheless, a contact area between the cathode electrode and the auxiliary electrode is so large that IR-drop cannot be efficiently lowered. To address this issue, isolation columns are generally formed between the cathode electrode and the auxiliary electrode. However, this increases manufacturing steps, lowering manufacturing efficiency.

Therefore, there is a need to provide an organic light emitting diode (OLED) display and a method for manufacturing the same in order to solve problems existing in prior art.

SUMMARY OF DISCLOSURE

The objective of the present disclosure is to provide an organic light emitting diode (OLED) display and a method for manufacturing the same in order to simplifying the manufacturing process and increasing the manufacturing efficiency.

To solve the aforementioned problems, the present disclosure provides a method for manufacturing an organic light emitting diode (OLED) display, comprising steps of:

forming an auxiliary electrode on a substrate;

forming a planarization layer on the auxiliary electrode, and patterning the planarization layer to form an opening in the planarization layer;

forming a transparent conductive layer on the planarization layer, and patterning the transparent conductive layer, such that the transparent conductive layer is located above the opening to shield a side of the opening that is adjacent to a non-display area, wherein the transparent conductive layer does not cover a sidewall of the opening;

forming at least one pixel defining layer on the transparent conductive layer, and patterning the pixel defining layer, such that the pixel defining layer is located above the opening to shield the side of the opening that is adjacent to the non-display area, wherein a shielding boundary of the pixel defining layer exceeds beyond a shielding boundary of the transparent conductive layer, and the shielding boundary is a boundary that is located above the opening to shield the opening;

forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening.

In addition, the present disclosure provides a method for manufacturing an organic light emitting diode (OLED) display, comprising steps of:

forming an auxiliary electrode on a substrate;

forming a planarization layer on the auxiliary electrode, and patterning the planarization layer to form an opening in the planarization layer;

forming a transparent conductive layer on the planarization layer, and patterning the transparent conductive layer, such that the transparent conductive layer is located above the opening to shield a side of the opening that is adjacent to a non-display area;

forming at least one pixel defining layer on the transparent conductive layer, and patterning the pixel defining layer, such that the pixel defining layer is located above the opening to shield the side of the opening that is adjacent to the non-display area;

forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening.

Moreover, the present disclosure provides an organic light emitting diode (OLED) display, comprising:

a substrate;

an auxiliary electrode disposed on the substrate;

a planarization layer disposed on the auxiliary electrode, wherein the planarization layer includes an opening;

a transparent conductive layer disposed on the planarization layer and located above the opening to shield a side of the opening that is adjacent to a non-display area;

at least one pixel defining layer disposed on the transparent conductive layer and located above the opening to shield the side of the opening that is adjacent to the non-display area;

an organic light emitting layer disposed on the pixel defining layer, wherein the organic light emitting layer partially covers a side of the auxiliary electrode that is adjacent to a display area; and a cathode electrode disposed on the organic light emitting layer, wherein the cathode electrode partially covers the side of the auxiliary electrode that is adjacent to the display area, and the cathode electrode is connected to the auxiliary electrode via the opening.

The present disclosure provides an OLED display and a method for manufacturing the same. The method comprises steps of forming an auxiliary electrode on a substrate; forming a planarization layer on the auxiliary electrode, and patterning the planarization layer to form an opening in the planarization layer; forming a transparent conductive layer on the planarization layer, and patterning the transparent conductive layer, such that the transparent conductive layer is located above the opening to shield a side of the opening that is adjacent to a non-display area; forming at least one pixel defining layer on the transparent conductive layer, and patterning the pixel defining layer, such that the pixel defining layer is located above the opening to shield the side of the opening that is adjacent to the non-display area; forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening. Therefore, the contact area between the cathode electrode and the auxiliary electrode is reduced, and there is no need to form isolation columns. Thus, IR-drop is lowered. In addition, the manufacturing process is simplified, thus increasing manufacturing efficiency.

DETAILED DESCRIPTION

Figure 1:
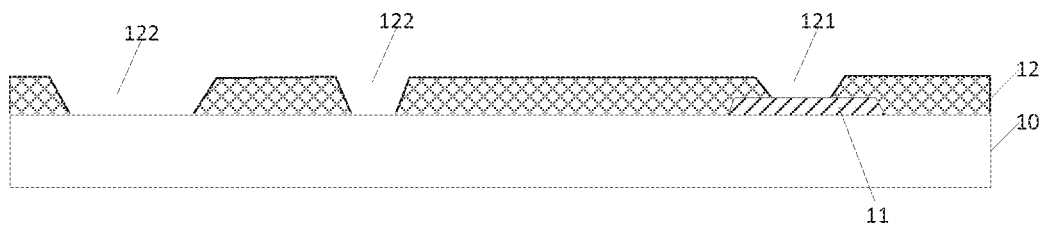
FIG. 1 shows a first step and a second step in a process flow of a method for manufacturing an organic light emitting diode (OLED) display according to the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIGS. 1-8. FIG. 1 shows a first step and a second step in a process flow of a method for manufacturing an organic light emitting diode (OLED) display according to the present disclosure.

According to the present disclosure, the method for manufacturing an OLED display comprises the following steps.

In a step S101, an auxiliary electrode is formed on a substrate.

For example, as shown in FIG. 1, an auxiliary electrode 11 is formed on a substrate 10. In one embodiment, the substrate 10 includes a glass baseplate and a switch array layer. The switch array layer includes a plurality of thin film transistors (TFTs), and the switch array layer includes a source electrode and a drain electrode in a cross-sectional view thereof. The auxiliary electrode 11 can be disposed in a same layer as where the source electrode and the drain electrode are disposed. That is, the auxiliary electrode 11 can be formed at the same time while the source electrode and the drain electrode are formed.

In a step S102, a planarization layer is formed on the auxiliary electrode, and the planarization layer is patterned to form an opening in the planarization layer.

For example, a planarization layer 12 is formed on the auxiliary electrode 11, and the planarization layer 12 is patterned to form an opening 121 in the planarization layer 12. In addition, a through-hole 122 is formed, where the through-hole 122 is configured to connect the anode electrode and the drain electrode. Formation of the opening 121 makes the auxiliary electrode 11 exposed. The planarization layer 12 can be formed by chemical vapor deposition (CVD), and can be made of polyimide (PI).

In a step S103, a transparent conductive layer is formed on the planarization layer, and the transparent conductive layer is patterned, such that the transparent conductive layer is located above the opening to shield a side of the opening that is adjacent to a non-display area.

Figure 2:
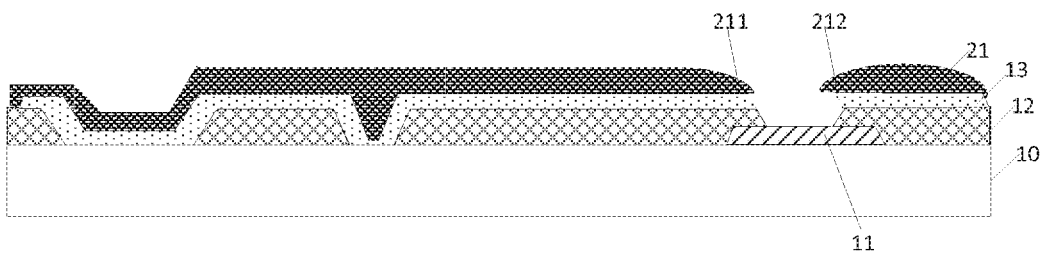
FIG. 2 shows a first substep of a third step in a process flow of a method for manufacturing an OLED display according to the present disclosure.
Figure 3:
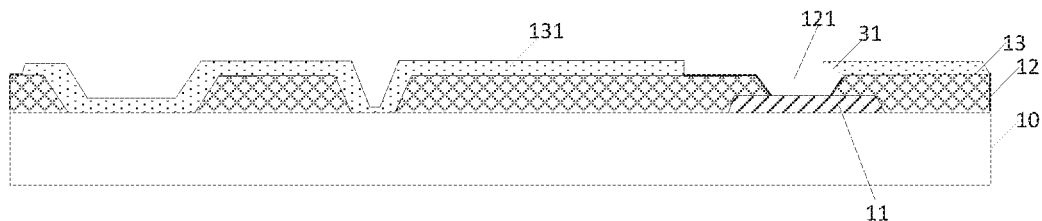
FIG. 3 shows a second substep of a third step in a process flow of a method for manufacturing an OLED display according to the present disclosure.

For example, as shown in FIGS. 2 and 3, a transparent conductive layer 13 is formed in the opening 121 and on the planarization layer 12, and the transparent conductive layer 13 is patterned, such that the transparent conductive layer 13 is located above the opening 121 to shield a side of the opening that is adjacent to a non-display area. The display includes a display area and a non-display area, where the display area is positioned to correspond to a light transparency area of an organic light emitting layer, and the non-display area is positioned to correspond to a wiring area which surrounds the light transparency area. Certainly, while the transparent conductive layer 13 is patterned, an anode electrode 131 is formed at the same time.

In the step S103, where the transparent conductive layer is patterned, such that the transparent conductive layer is located above the opening to shield the side of the opening that is adjacent to the non-display area, the step S103 comprises a step S201 and s step S202.

In the step S201, a photoresist layer is formed on the transparent conductive layer, such that a boundary of the photoresist layer located above the opening exceeds beyond a boundary of the transparent conductive layer located above the opening.

For example, as shown in FIG. 2, a photoresist is coated on the transparent conductive layer 13 to form a photoresist layer 21, such that a boundary of the photoresist layer 21 located above the opening 121 after being exposed and developed exceeds beyond a boundary of the transparent conductive layer 13 located above the opening 121. For instance, both the right-side and left-side boundaries 211 and 212 of the photoresist layer 21 located above the opening 121 exceed beyond the boundary of the transparent conductive layer 13 located above the opening 121. That is, both the right-side and left-side edges of the photoresist layer 21 located above the opening 121 exceed beyond the edge of the transparent conductive layer 13 located above the opening 121.

In the step S202, the transparent conductive layer is etched, such that the transparent conductive layer is located above the opening to shield the side of the opening that is adjacent to the non-display area.

For example, a wet etching step is performed for the transparent conductive layer 13, such that the transparent conductive layer 13 is located above the opening to shield the side (i.e., the right side in FIG. 2) of the opening that is adjacent to the non-display area. After this step is performed, the transparent conductive layer 13 does not cover a sidewall of the opening 121, and the transparent conductive layer 13 does not cover the auxiliary electrode 11.

As shown in FIG. 3, while the step of etching the transparent conductive layer 13 is performed, the transparent conductive layer 13 located above the opening 121 to shield the opening 121 is formed to have an inclined sidewall 31, and an angle between the inclined sidewall 31 and a horizontal line is an obtuse angle. In other words, the transparent conductive layer 13 located above the opening 121 to shield the opening 121 is formed to include a cut corner having a downwardly inclined slope.

The transparent conductive layer 13 can be made of indium tin oxide (ITO)/Ag/ITO.

In a step S104, at least one pixel defining layer is formed on the transparent conductive layer, and the pixel defining layer is patterned, such that the pixel defining layer is located above the opening to shield the side of the opening that is adjacent to the non-display area.

Figure 4:
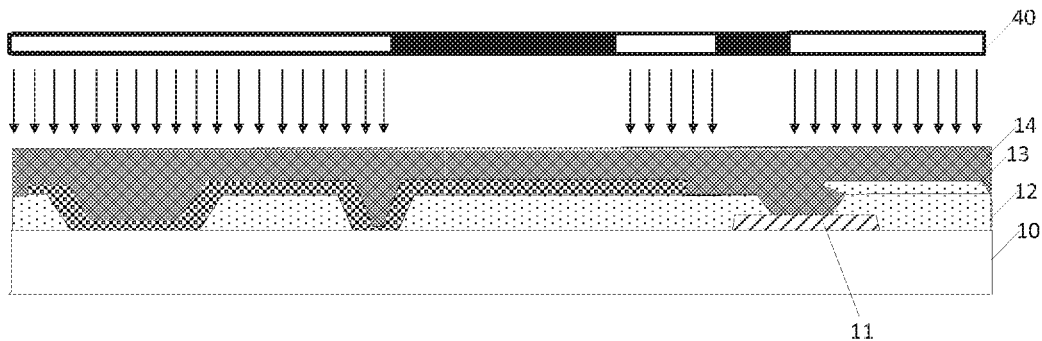
FIG. 4 shows a first substep of a fourth step in a process flow of a method for manufacturing an OLED display according to the present disclosure.
Figure 5:
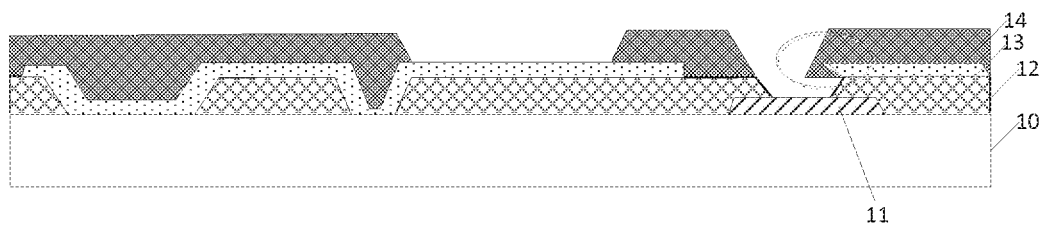
FIG. 5 shows a second substep of a fourth step in a process flow of a method for manufacturing an OLED display according to the present disclosure.

For example, please see FIGS. 4 and 5. In one embodiment, a first pixel defining layer 14 is formed in the opening 121 and on the transparent conductive layer 13, and the first pixel defining layer 14 is patterned, such that the first pixel defining layer 14 is located above the opening to shield the side of the opening 121 that is adjacent to the non-display area. A shielding boundary of the first pixel defining layer 14 exceeds beyond a shielding boundary of the transparent conductive layer 13 (as shown in the area bounded by the dotted line in FIG. 5), wherein the shielding boundary is a boundary that is located above the opening 121 to shield the opening 121. That is, the shielding boundary of the first pixel defining layer 14 covers the shielding boundary of the transparent conductive layer 13. In other words, the edge of the first pixel defining layer 14 located above the opening to shield one side of the opening 121 exceeds beyond the edge of the transparent conductive layer 13 located above the opening to shield this side of the opening 121. The first pixel defining layer 14 does not cover the sidewall of the opening 121.

The first pixel defining layer 14 is made of a photoresist material, e.g., a negative type photoresist material. Specifically, as shown in FIG. 4, a photoresist material is coated on entire surface of the substrate 10. Next, a mask 40 is used to perform exposure for the photoresist material, and then development is performed for the photoresist material. By controlling width and depth of light used for exposure, the first pixel defining layer 14 is formed to also include a cut corner positioned to correspond to the cut corner of the transparent conductive layer 13. An angle between the sidewall of the first pixel defining layer 14 located above the opening 121 to shield one side of the opening 121 and a horizontal line is an acute angle.

Figure 6:
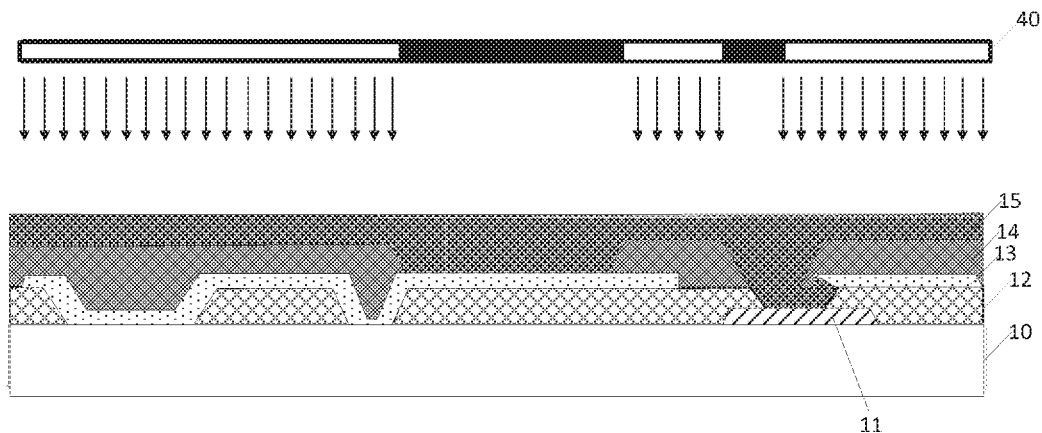
FIG. 6 shows a first substep of a fifth step in a process flow of a method for manufacturing an OLED display according to the present disclosure.
Figure 7:
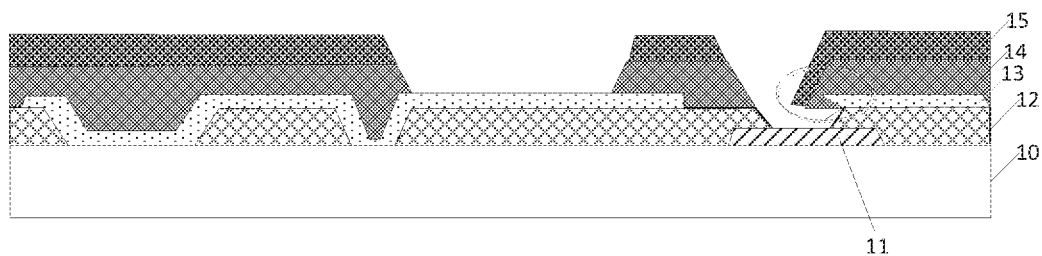
FIG. 7 shows a second substep of a fifth step in a process flow of a method for manufacturing an OLED display according to the present disclosure.

Please see FIG. 6. In another embodiment, forming at least one pixel defining layer on the transparent conductive layer in the step S104 comprises:

a step S301 of forming a first pixel defining layer and a second pixel defining layer on the transparent conductive layer.

For example, a first pixel defining layer 14 and a second pixel defining layer 15 are formed in the opening 121 and on the transparent conductive layer 13.

Patterning the pixel defining layer in the step S104 comprises:

a step S302 of patterning the first pixel defining layer 14 and the second pixel defining layer 15, respectively, such that a shielding boundary of the second pixel defining layer 15 exceeds beyond the shielding boundary of the first pixel defining layer 14, and the shielding boundary of the first pixel defining layer 14 exceeds beyond the shielding boundary of the transparent conductive layer 13.

That is, the edge of the second pixel defining layer 15 located above the opening 121 to shield one side of the opening 121 exceeds beyond the edge of the first pixel defining layer 14 located above the opening 121 to shield this side of the opening 121.

Specifically, the first pixel defining layer 14 is formed by performing steps described above. The second pixel defining layer 15 is formed by performing the following steps. A photoresist material is coated on entire surface of the substrate 10. Next, a mask 40 is used to perform exposure for the photoresist material, and then development is performed for the photoresist material. By controlling width and depth of light used for exposure, the second pixel defining layer 15 is formed to also include a cut corner positioned to correspond to the cut corner of the transparent conductive layer 13. An angle between the sidewall of the second pixel defining layer 15 located above the opening 121 to shield one side of the opening 121 and a horizontal line is an acute angle, as shown in the area bounded by the dotted line in FIG. 7.

The second pixel defining layer 15 is also made of a photoresist material, e.g., a negative type photoresist material. The first pixel defining layer 14 and the second pixel defining layer 15 can be made of a same material.

In a step S105, an organic light emitting layer is formed on the pixel defining layer by evaporation, such that the organic light emitting layer partially covers a side of the auxiliary electrode that is adjacent to a display area.

Figure 8:
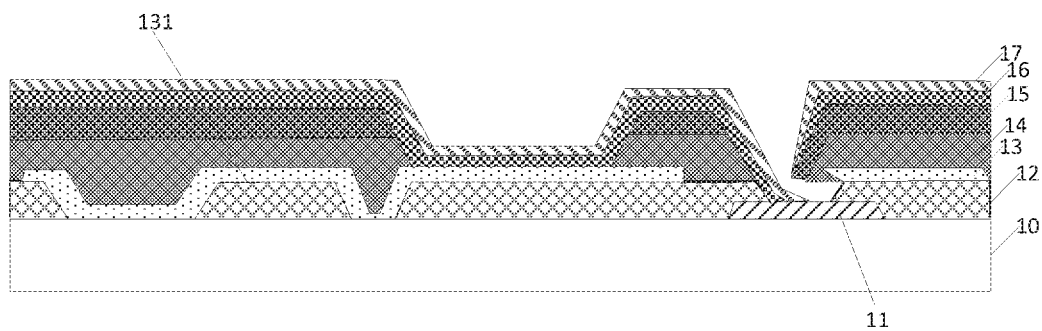
FIG. 8 shows a sixth step and a seventh step in a process flow of a method for manufacturing an OLED display according to the present disclosure.

For example, as shown in FIG. 8, an organic light emitting layer 16 is formed on the pixel defining layer by evaporation, such that the organic light emitting layer 16 partially covers a side of the auxiliary electrode) 1 that is adjacent to a display area. That is, the organic light emitting layer 16 partially covers the left side of the auxiliary electrode 11.

To further reduce the contact area between the cathode electrode and the auxiliary electrode, the step of forming an organic light emitting layer on the pixel defining layer by evaporation, such that the organic light emitting layer partially covers a side of the auxiliary electrode that is adjacent to a display area, comprises:

a step S1051 of controlling an evaporation angle of an evaporation source used for forming the organic light emitting layer, so as to make the organic light emitting layer be formed to partially cover the side of the auxiliary electrode that is adjacent to the display area.

For example, an evaporation angle of an evaporation source used for forming the organic light emitting layer 16 is controlled, such that the organic light emitting layer 16 cannot entirely cover the auxiliary electrode 11.

In a step S106, a cathode electrode is formed on the organic light emitting layer, such that the cathode electrode partially covers the side of the auxiliary electrode that is adjacent to the display area, and the cathode electrode is connected to the auxiliary electrode via the opening.

For example, in one embodiment, a cathode electrode 17 is formed on the organic light emitting layer 16, such that the cathode electrode 17 partially covers the side of the auxiliary electrode 11 that is adjacent to the display area, and the cathode electrode 17 is connected to the auxiliary electrode 11 via the opening 121.

For instance, an evaporation angle of an evaporation source used for forming the cathode electrode 17 is controlled, so as to make the cathode electrode 17 be formed to partially cover the side of the auxiliary electrode that is adjacent to the display area. Specifically, while the cathode electrode 17 is formed by evaporation, an evaporation angle of an evaporation source used for forming the cathode electrode 17 is controlled, such that the cathode electrode 17 could contact the auxiliary electrode 11, and a contact area between the cathode electrode 17 and the auxiliary electrode 11 is smaller, therefore IR-drop is lowered.

Because the transparent conductive layer and the pixel defining layer located above the opening to shield a side of the opening function to isolate the cathode electrode, the organic light emitting layer cannot entirely cover the auxiliary electrode, and the cathode electrode partially covers the auxiliary electrode. Therefore, the contact area between the cathode electrode and the auxiliary electrode is reduced, and IR-drop is lowered. In addition, because there is no need to form isolation columns, the manufacturing process is simplified, and the manufacturing cost is reduced.

In another embodiment, the auxiliary electrode 11 is formed from the transparent conductive layer located at a bottom portion of the opening 121. That is, the auxiliary electrode 11 is formed at the same time while the transparent conductive layer is formed, the auxiliary electrode 11 and the anode electrode are formed in a same process step.

Please see FIG. 8. The present disclosure further provides an organic light emitting diode (OLED) display, comprising a substrate 10, an auxiliary electrode 11, a planarization layer 12, a transparent conductive layer 13, at least one pixel defining layer, an organic light emitting layer 16, and a cathode electrode 17. The display further comprises an auxiliary electrode 11, wherein the auxiliary electrode 11 is positioned to correspond to the opening 121, as shown in FIG. 3.

The auxiliary electrode 11 is disposed on the substrate 10. The planarization layer 12 is disposed on the auxiliary electrode 11, wherein the planarization layer 12 includes an opening 121.

As shown in FIG. 3, the transparent conductive layer 13 is disposed on the planarization layer 12 and located above the opening 121 to shield a side of the opening 121 that is adjacent to a non-display area.

The at least one pixel defining layer is disposed on the transparent conductive layer 13 and located above the opening 121 to shield the side of the opening 121 that is adjacent to the non-display area. Both the transparent conductive layer 13 and the pixel defining layer do not cover the auxiliary electrode 11. A shielding boundary of the pixel defining layer exceeds beyond a shielding boundary of the transparent conductive layer 13, wherein the shielding boundary is a boundary that is located above the opening 121 to shield the opening 121.

The organic light emitting layer 16 is disposed on the pixel defining layer 14, wherein the organic light emitting layer 16 partially covers a side of the auxiliary electrode 11 that is adjacent to a display area.

The cathode electrode 17 is disposed on the organic light emitting layer 16, wherein the cathode electrode 17 partially covers the side of the auxiliary electrode 11 that is adjacent to the display area, and the cathode electrode 17 is connected to the auxiliary electrode 11 via the opening 121.

As shown in FIG. 3, the transparent conductive layer 13 located above the opening 121 to shield the opening 121 includes an inclined sidewall 31, and an angle between the inclined sidewall 31 and a horizontal line is an obtuse angle.

In one embodiment, the display includes a first pixel defining layer 14 and a second pixel defining layer 15. A shielding boundary of the second pixel defining layer 15 exceeds beyond the shielding boundary of the first pixel defining layer 14, and the shielding boundary of the first pixel defining layer 14 exceeds beyond the shielding boundary of the transparent conductive layer 13.

It is understood that the auxiliary electrode 11 can be formed at the same time while the anode electrode in the display area is formed.

The OLED display of the present disclosure can be manufactured according the manufacturing method described above.

The present disclosure provides an OLED display and a method for manufacturing the same. The method comprises steps of forming an auxiliary electrode on a substrate; forming a planarization layer on the auxiliary electrode, and patterning the planarization layer to form an opening in the planarization layer; forming a transparent conductive layer on the planarization layer, and patterning the transparent conductive layer, such that the transparent conductive layer is located above the opening to shield a side of the opening that is adjacent to a non-display area; forming at least one pixel defining layer on the transparent conductive layer, and patterning the pixel defining layer, such that the pixel defining layer is located above the opening to shield the side of the opening that is adjacent to the non-display area; forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening. Therefore, the contact area between the cathode electrode and the auxiliary electrode is reduced, and there is no need to form isolation columns. Thus, IR-drop is lowered. In addition, the manufacturing process is simplified, thus increasing manufacturing efficiency.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an organic light emitting diode (OLED) display, comprising steps of:
   forming an auxiliary electrode on a substrate;

forming a planarization layer on the auxiliary electrode, and patterning the planarization layer to form an opening in the planarization layer;

forming a transparent conductive layer on the planarization layer, and patterning the transparent conductive layer, such that the transparent conductive layer is located above the opening to shield a side of the opening that is adjacent to a non-display area, wherein the transparent conductive layer does not cover a sidewall of the opening;

forming at least one pixel defining layer on the transparent conductive layer, and patterning the pixel defining layer, such that the pixel defining layer is located above the opening to shield the side of the opening that is adjacent to the non-display area, wherein a shielding boundary of the pixel defining layer exceeds beyond a shielding boundary of the transparent conductive layer, and the shielding boundary is a boundary that is located above the opening to shield the opening;

forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening, wherein the auxiliary electrode is formed from the transparent conductive layer located at a bottom portion of the opening.

2. The method for manufacturing the OLED display according to claim 1, wherein the step of patterning the transparent conductive layer, such that the transparent conductive layer is located above the opening to shield the side of the opening that is adjacent to the non-display area, comprises:

forming a photoresist layer on the transparent conductive layer, such that a boundary of the photoresist layer located above the opening exceeds beyond a boundary of the transparent conductive layer located above the opening; and etching the transparent conductive layer, such that the transparent conductive layer is located above the opening to shield the side of the opening that is adjacent to the non-display area.

3. The method for manufacturing the OLED display according to claim 2, wherein while the step of etching the transparent conductive layer is performed, the transparent conductive layer located above the opening to shield the opening is formed to include an inclined sidewall, and an angle between the inclined sidewall and a horizontal line is an obtuse angle.

4. The method for manufacturing the OLED display according to claim 1, wherein the step of forming at least one pixel defining layer on the transparent conductive layer comprises:

forming a first pixel defining layer and a second pixel defining layer on the transparent conductive layer; and the step of patterning the pixel defining layer comprises:

patterning the first pixel defining layer and the second pixel defining layer, respectively, such that the the shielding boundary of the second pixel defining layer exceeds beyond a shielding boundary of the first pixel defining layer, and the shielding boundary of the first pixel defining layer exceeds beyond the shielding boundary of the transparent conductive layer.

5. The method for manufacturing the OLED display according to claim 1, wherein the pixel defining layer is made of a photoresist material.

6. The method for manufacturing the OLED display according to claim 1, wherein the step of forming the organic light emitting layer on the pixel defining layer by evaporation, such that the organic light emitting layer partially covers the side of the auxiliary electrode that is adjacent to the display area, comprises:

controlling an evaporation angle of an evaporation source used for forming the organic light emitting layer, so as to make the organic light emitting layer be formed to partially cover the side of the auxiliary electrode that is adjacent to the display area.

7. A method for manufacturing an organic light emitting diode (OLED) display, comprising steps of:

forming an auxiliary electrode on a substrate;

forming a planarization layer on the auxiliary electrode, and patterning the planarization layer to form an opening in the planarization layer;

forming a transparent conductive layer on the planarization layer, and patterning the transparent conductive layer, such that the transparent conductive layer is located above the opening to shield a side of the opening that is adjacent to a non-display area;

forming at least one pixel defining layer on the transparent conductive layer, and patterning the pixel defining layer, such that the pixel defining layer is located above the opening to shield the side of the opening that is adjacent to the non-display area;

forming an organic light emitting layer on the pixel defining layer by evaporation, such that the organic light emitting layer partially covers a side of the auxiliary electrode that is adjacent to a display area; and forming a cathode electrode on the organic light emitting layer, such that the cathode electrode partially covers the side of the auxiliary electrode that is adjacent to the display area, and the cathode electrode is connected to the auxiliary electrode via the opening, wherein the auxiliary electrode is formed from the transparent conductive layer located at a bottom portion of the opening.

8. The method for manufacturing the OLED display according to claim 7, wherein the step of patterning the transparent conductive layer, such that the transparent conductive layer is located above the opening to shield the side of the opening that is adjacent to the non-display area, comprises:

forming a photoresist layer on the transparent conductive layer, such that a boundary of the photoresist layer located above the opening exceeds beyond a boundary of the transparent conductive layer located above the opening; and etching the transparent conductive layer, such that the transparent conductive layer is located above the opening to shield the side of the opening that is adjacent to the non-display area.

9. The method for manufacturing the OLED display according to claim 8, wherein while the step of etching the transparent conductive layer is performed, the transparent conductive layer located above the opening to shield the opening is formed to include an inclined sidewall, and an angle between the inclined sidewall and a horizontal line is an obtuse angle.

10. The method for manufacturing the OLED display according to claim 7, wherein a shielding boundary of the pixel defining layer exceeds beyond a shielding boundary of the transparent conductive layer, and the shielding boundary is a boundary that is located above the opening to shield the opening.

11. The method for manufacturing the OLED display according to claim 10, wherein the step of forming at least one pixel defining layer on the transparent conductive layer comprises:

forming a first pixel defining layer and a second pixel defining layer on the transparent conductive layer; and the step of patterning the pixel defining layer comprises:

patterning the first pixel defining layer and the second pixel defining layer, respectively, such that the a shielding boundary of the second pixel defining layer exceeds beyond a shielding boundary of the first pixel defining layer, and the shielding boundary of the first pixel defining layer exceeds beyond the shielding boundary of the transparent conductive layer.

12. The method for manufacturing the OLED display according to claim 7, wherein the pixel defining layer is made of a photoresist material.

13. The method for manufacturing the OLED display according to claim 7, wherein the transparent conductive layer does not cover a sidewall of the opening.

14. The method for manufacturing the OLED display according to claim 7, wherein the step of forming the organic light emitting layer on the pixel defining layer by evaporation, such that the organic light emitting layer partially covers the side of the auxiliary electrode that is adjacent to the display area, comprises:

controlling an evaporation angle of an evaporation source used for forming the organic light emitting layer, so as to make the organic light emitting layer be formed to partially cover the side of the auxiliary electrode that is adjacent to the display area.

15. An organic light emitting diode (OLED) display, comprising:

a substrate;

an auxiliary electrode disposed on the substrate;

a planarization layer disposed on the auxiliary electrode, wherein the planarization layer includes an opening;

a transparent conductive layer disposed on the planarization layer and located above the opening to shield a side of the opening that is adjacent to a non-display area;

at least one pixel defining layer disposed on the transparent conductive layer and located above the opening to shield the side of the opening that is adjacent to the non-display area;

an organic light emitting layer disposed on the pixel defining layer, wherein the organic light emitting layer partially covers a side of the auxiliary electrode that is adjacent to a display area; and a cathode electrode disposed on the organic light emitting layer, wherein the cathode electrode partially covers the side of the auxiliary electrode that is adjacent to the display area, and the cathode electrode is connected to the auxiliary electrode via the opening, wherein the auxiliary electrode is formed from the transparent conductive layer located at a bottom portion of the opening.

16. The OLED display according to claim 15, wherein the transparent conductive layer located above the opening to shield the opening includes an inclined sidewall, and an angle between the inclined sidewall and a horizontal line is an obtuse angle.

17. The OLED display according to claim 15, wherein a shielding boundary of the pixel defining layer exceeds beyond a shielding boundary of the transparent conductive layer, and the shielding boundary is a boundary that is located above the opening to shield the opening.

18. The OLED display according to claim 15, wherein the pixel defining layer is made of a photoresist material.

* * * * *